United States Patent [19]

Charaska et al.

[11] Patent Number: 5,379,039
[45] Date of Patent: Jan. 3, 1995

[54] METHOD AND IMPROVED APPARATUS FOR STABILIZING ANALOG-TO-DIGITAL CIRCUITS

[75] Inventors: Joseph A. Charaska, Melrose Park; Mark A. Gannon, Sleepy Hollow; Paul H. Gailus, Prospect Heights, all of Ill.

[73] Assignee: Motorola Inc., Schaumburg, Del.

[21] Appl. No.: 96,386

[22] Filed: Jul. 26, 1993

[51] Int. Cl.6 ............................................. H03M 3/02
[52] U.S. Cl. ..................................... 341/143; 341/155
[58] Field of Search ............... 341/143, 132, 139, 120, 341/155, 166; 375/28, 98

[56] References Cited

U.S. PATENT DOCUMENTS 5,012,244 10/1989 Wellard et al. ..................... 341/143
5,083,304 1/1992 Cahill ..................................... 375/98

Primary Examiner—Brian K. Young
Attorney, Agent, or Firm—Timothy W. Markinson; Christopher P. Moren

[57] ABSTRACT

An analog-to-digital (A/D) circuit comprising a multi-pole gain stage, a quantizer, and a feedback stage is stabilized when an analog input signal is excessive in the following manner. A stabilization detector continually samples a representation of stabilization of the A/D circuit. When the representation of stabilization is unfavorable, the stabilization detector increases, via a stabilizer, phase margin by adjusting the pole locations of the multi-pole gain stage based on the degree of unfavorability of the representation of stabilization. With the increased phase margin, the A/D circuit continues to provide digital representations of the analog input signal.

14 Claims, 3 Drawing Sheets

METHOD AND IMPROVED APPARATUS FOR STABILIZING ANALOG-TO-DIGITAL CIRCUITS

FIELD OF THE INVENTION

The present invention relates generally to analog-to-digital circuits and, in particular, to a method and apparatus for stabilizing analog-to-digital circuits.

BACKGROUND OF THE INVENTION

Analog-to-digital (A/D) circuits are known to comprise devices capable of converting analog wave forms in to corresponding digital representations. Sigma-delta A/D circuits are one type of A/D circuit known in the art. In a sigma-delta A/D converter, the analog wave form is inputted to an integrating lowpass filter, the output of which serves as input to a one bit quantizer. The output of the one bit quantizer serves not only as the digital output of the sigma-delta A/D converter, but it is also fed back and summed with the analog input to produce a difference signal at the input of the integrating lowpass filter. An error signal is produced as the integrating lowpass filter operates on the difference signal. In essence, the sigma-delta A/D converter attempts to produce digital representations of the input signal such that the error signal is continually minimized. Ideally, the resulting power spectral density of the digital representation will substantially match that of the analog input, with the addition of quantization noise. The spectral shape of the quantization noise is greatly influenced by the frequency characteristics of the integrating lowpass filter.

Typically, the integrating lowpass filter utilizes multiple integration stages to realize effective out-of band attenuation of quantization noise. A cost, however, associated with the use of higher order integrating filters is their inherent instability. When an analog input becomes excessively large, this instability can result in uncontrollable oscillations at the output of the sigma-delta A/D converter, and hence, in the loss of information contained in the analog input. Only when the input has been sufficiently reduced will the oscillations cease and normal operations continue. Of course, this situation can be resolved in several ways. Rather than using multi-stage integrating filters, a single stage (single pole) filter can be used. Single pole integrating filters, referred to as first order filters, guarantee stability, but do not offer sufficient noise suppression performance. In another solution, the analog input could be limited prior to the sigma-delta A/D converter thereby ensuring stability. The distortion resulting from the use of limiting, however, could significantly degrade the digital representation.

In radio communication systems, automatic gain control (AGC) is often used to adjust received signals input to a sigma-delta A/D converter. By continually adjusting the amount of gain applied to the received signals, an AGC with a relatively slow attack time helps prevent the overload condition from occurring. When large, instantaneous interfering signals are present, however, the AGC alone cannot prevent an overload condition from occurring and information in the desired signal is lost. Furthermore, the recovery time of the AGC after an overload condition is typically slowed such that the response of the radio receiver is notably slowed.

A solution to this problem has been put forth in U.S. Pat. No. 5,012,244 issued to Wellard et. al. Wellard discloses a sigma-delta A/D converter utilizing a multistage integrating filter with an additional oscillation detect and reset circuit. When an unstable condition in the form of oscillations occurs, the oscillation detect and reset circuit causes switches, disposed across the inputs and outputs of the integrating stages, to be closed such that the information present in the circuit is zeroed, and hence lost. In this way, the circuit can reestablish stability that, upon detection, causes the switches to be opened, thus allowing normal operation to continue. A shortcoming of this approach, however, is that during that period of time in which the switches are closed, the converter is inoperable and does not produce any digital representation of the input signal. Therefore, a need exists for a method that facilitates the stability of A/D converters without the use of analog input level reductions or limiting and furthermore allows continuous operation during periods of instability.

DESCRIPTION OF A PREFERRED EMBODIMENT

Generally, the present invention provides a method and apparatus for stabilizing an A/D circuit when the analog input to the A/D is excessive. This is accomplished by continuously sampling a representation of stabilization of the A/D circuit and dynamically increasing or decreasing open-loop phase margin by adjusting the pole locations of a multi-pole gain stage. The amount of change in phase margin is based upon degree of unfavorability of the representation of stabilization. With such a method, excessive input analog signals can be accurately converted to digital signals without disabling the A/D converter or losing the information.

Figure 1:
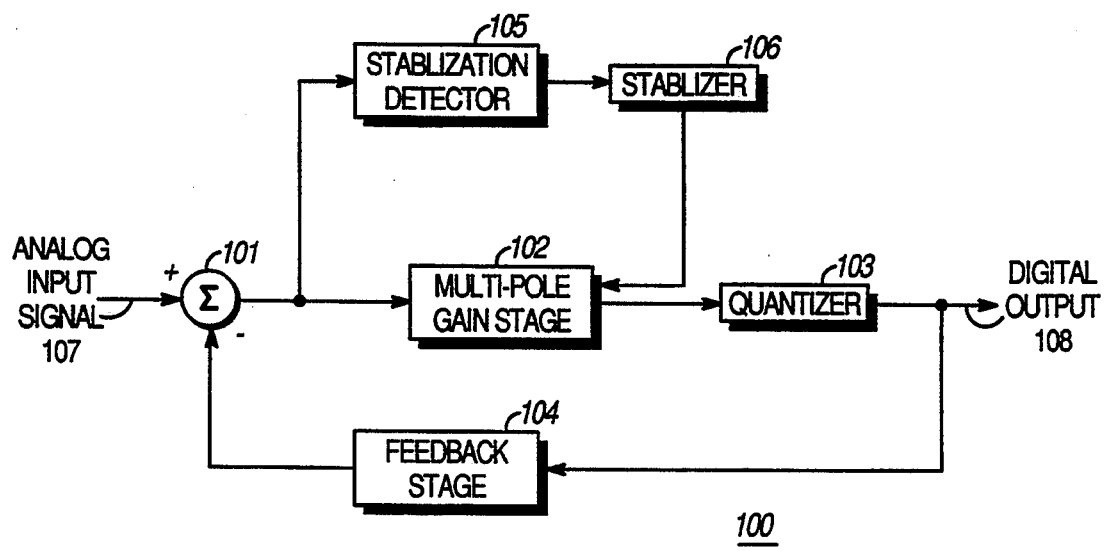
FIG. 1 illustrates an A/D circuit in accordance with the present invention.

The present invention can be more fully described with references to FIGS. 1–4. FIG. 1 illustrates an A/D circuit (100) which comprises an input summation stage (101), a multi-pole gain stage (102), a quantizer (103), a feedback stage (104), a stabilization detector (105) and a stabilizer (106). The input summation stage (101) may comprise a junction at which an analog input signal (107), represented as a current, is summed with the output signal of the feedback stage (104), also represented as a current, to form a composite current. The multiple pole gain stage (102) may comprise a second order lowpass filter with integrating stages such that the composite current output of the input summation stage (101) is integrated to produce an error signal. The quantizer (103) produces a digital output (108) and may comprise a high gain amplifier with a large input impedance and with an output capable of generating only binary states of the type used to drive digital logic circuits. The feedback stage (104) may comprise a device capable of accepting binary states of the type used to drive digital logic circuits as input and producing an analog signal, which can take a value only at quantized levels, as output. In a preferred embodiment, the A/D circuit (100) comprises a sigma-delta A/D circuit and is manufactured as an integrated circuit (IC). It is understood that the A/D circuit (100) could also be fabricated using discrete elements to achieve the same ends.

The stabilization detector (105) and the stabilizer (106) operate within the A/D circuit (100) to reduce the degree of unfavorable operation of the A/D when the analog input signal (107) is excessive. In a preferred embodiment, an indication of the stability of the A/D (representation of stabilization) is derived from the integrated output of the summation stage (101) i.e. the error signal. Those skilled in the art will recognize that there are other points within the A/D circuit (100) from which the representation of stabilization could be derived. As the output of the feedback stage (104) compares unfavorably with the analog input signal (107), the representation of stabilization also becomes unfavorable. That is, as the analog input signal (107) becomes excessively large, the output of the feedback stage (104) will attempt to reduce the resultant error signal and, as those skilled in the art will recognize, large oscillations not indicative of the analog input signal (107) will result throughout the A/D circuit (100) due to the 90 degree phase shifts contributed by each pole of the multi-pole gain stage (102).

The stabilization detector (105) continuously samples the representation of stabilization and, based on degree of unfavorability, issues a signal to the stabilizer (106). The stabilizer (106), based on the signal that it receives from the stabilization detector (105), modifies at least the open-loop phase margin by adjusting pole locations of the multi-pole gain stage (102). When referring to changes in phase margin, and gain margin, it is understood that such changes are relevant to the open-loop transfer function of the A/D circuit (100) in general, and in particular to those components that contribute to the open-loop transfer function, i.e., the multi-pole gain stage (102), the quantizer stage (103), and the feedback stage (104). In a preferred embodiment, when the degree of unfavorability of the representation stabilization increases above a predetermined limit ( i. e., large oscillations are detected), the stabilization detector (105) and the stabilizer (106) respond to alter the pole positions of the multi-pole gain stage (102) such that the open-loop phase margin is increased. In this manner, the oscillations resulting from the large input become destructive rather than constructive, thereby reducing the degree of unfavorability of the representation of stabilization and consequently improving the representation of the analog input signal (107).

As the degree of unfavorability of the representation of stabilization increases and decreases, the open-loop phase margin is correspondingly increased and decreased. Once the degree of unfavorability of the representation of stabilization has dropped sufficiently, normal operation of the A/D circuit (100) continues. In this manner, the A/D circuit (100) is able to recover from periods of instability, which results from excessive input signals, while continuously providing an accurate digital representation of the input signal.

Figure 2:
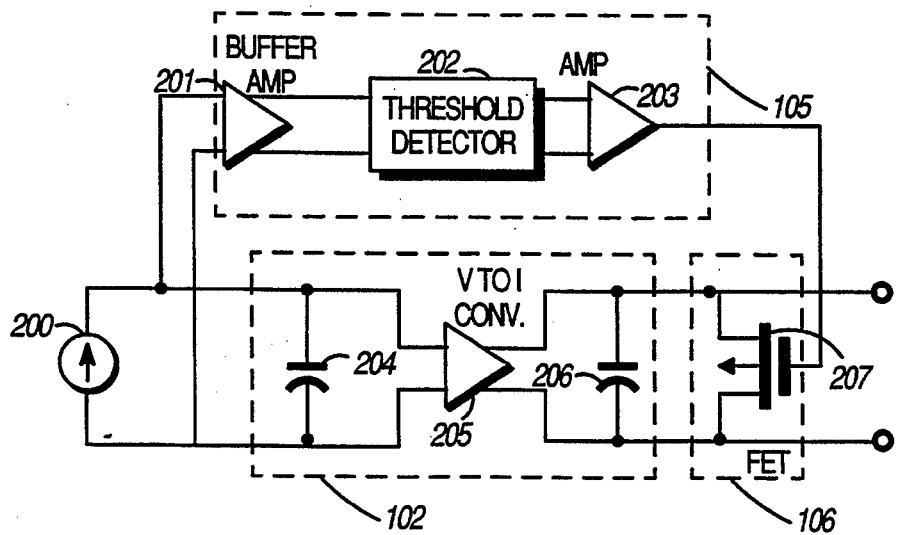
FIG. 2 illustrates a more detailed depiction of an A/D circuit in accordance with the present invention.

FIG. 2 illustrates a more detailed depiction of the multi-pole gain stage (102), the stabilization detector (105), and the stabilizer (106). The output of the input summation stage (101) is represented as an analog input current source (200). As shown, the stabilization detector (105) comprises a buffer amplifier (201), a threshold detector (202), and an amplifier (203). These elements of stabilization detector (105) can be implemented with either bipolar or field-effect transistors (FET), diodes, and resistors, preferably in the form of an integrated circuit.

The multi-pole gain stage (102) comprises a voltage-to-current converter (205) and filter poles (204, 206), which poles are implemented with capacitors. These two filter poles (204, 206) provide a second-order frequency response characteristic. More filter poles may be added by cascading one or more additional voltage-to-current converters and capacitors. Those skilled in the art will appreciate that stability considerations may limit the application of higher order filters, and that filter zeroes may need to be added when using two or more filter poles. It is understood that the multi-pole gain stage (102) could also be realized with known lowpass integrating filters using voltage amplifier stages, wherein each capacitor is placed between the amplifier output and the inverting input.

Within the stabilization detector (105), the buffer amplifier (201) provides high input impedance thereby minimizing undesired loading effects. The buffer amplifier (201) also provides sufficient gain to amplify the representation of stabilization input to the stabilization detector (105) such that a reliable comparison can be made with a threshold level in the threshold detector (202). The threshold detector (202) compares its input signal to the threshold level and provides an output signal proportional to the magnitude by which the input signal exceeds the threshold level. For input signal magnitudes below the threshold level, the threshold detector (202) provides a constant output signal in order to disable the operation of the stabilizer (106). The threshold detector (202) contains circuits, which may consist of a resistive divider of available voltages, a band-gap reference, or other known circuit arrangements, to generate the threshold level signal. In order to provide a constant signal output for inputs below the threshold level, the threshold detector (202) also contains a clamping element that is substantially linear at inputs above the applied threshold level signal, but which becomes nonlinear for inputs below the threshold level signal and instead clamps the output to a constant value. In order for the threshold detector (202) to be responsive to the magnitude of the input signal regardless of its polarity, the outputs of two such clamping elements may be summed together, where one of the clamping elements has an inverted input signal polarity. The amplifier (203) following the threshold detector (202) provides gain and any shift in DC level necessary to bring the signal within the input operating range of the stabilizer (106).

The stabilizer (106) comprises a field-effect transistor (207). The FET (207) provides an output conductance from drain to source terminals which varies in proportion to the applied input gate voltage. Placement of this variable conductance across the capacitor forming the second pole (206) provides a controllable adjustment of the pole locations of the multi-pole gain stage (102). Other means for adjusting the conductance are also suitable i.e. a resistor network with switches that are progressively enabled in response to an input voltage. For implementations of the multi-pole gain stage (102) with more than two poles, a stabilizer having an additional FET or equivalent element across each added capacitor could be used to adjust the phase and gain. It is understood that an increase in phase margin can also be accomplished by increasing bandwidth of the multi-pole gain stage (102).

Figure 3:
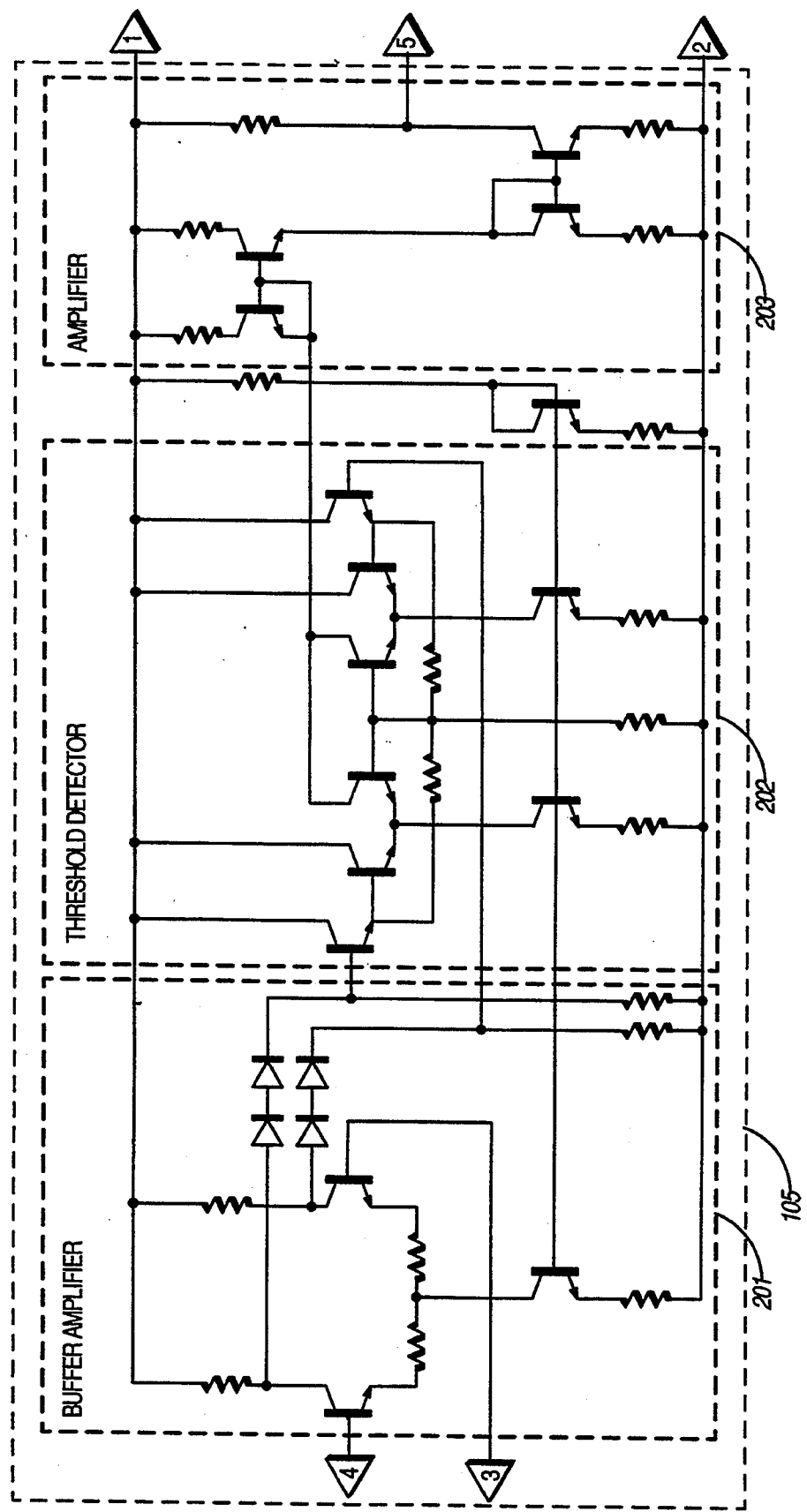
FIG. 3 illustrates a more detailed depiction of a stabilization detector.

FIG. 3 illustrates a more detailed depiction of the stabilization detector (105). The circuits comprising the buffer amplifier (201), the threshold detector (202), and the amplifier (203) may be comprised with standard components. The transistors, diodes, and resistors may be in discrete form, in integrated circuit arrays, or on a single integrated circuit.

Figure 4:
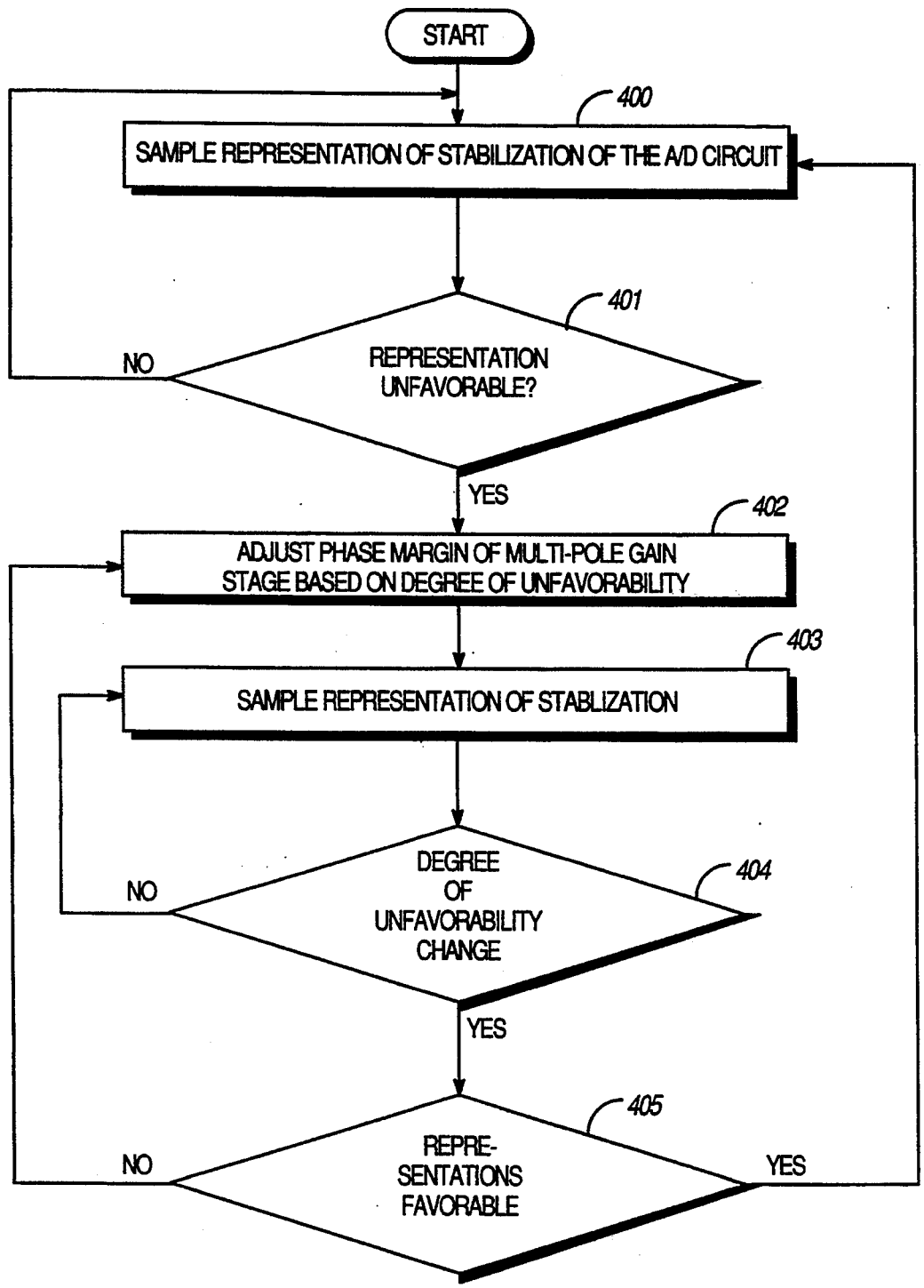
FIG. 4 illustrates a logic diagram which describes the operation of the present invention.

FIG. 4 illustrates a logic diagram which describes the operation of the present invention. At step 400, a representation of the stabilization of the A/D circuit is sampled by the stabilization detector (105). The representation of stabilization describes the distortion of the quantizer (103) output relative to the analog input signal (107). In a preferred embodiment, this distortion is derived from the output of the summation stage (101) and is obtained as the difference of the analog input signal (107) and the output of the feedback stage (104).

As the representation of stabilization is continuously sampled (400), its degree of unfavorability is determined (401). More precisely, the output of threshold detector (202) represents the degree of unfavorability of the A/D stabilization. The representation of the stabilization is unfavorable when the signal level into the stabilization detector (105) is greater than the threshold level found in the threshold detector (202). In a preferred embodiment, the threshold level is set to approximately 40 mV peak-to-peak. Signals inputted to the stabilization detector (105) that exceed the threshold level will cause the threshold detector (202) to produce an output signal that is proportional to the amount by which the input signal exceeds the threshold. It is understood that the threshold value is dependent upon the gain of the buffer amplifier (201) and the gain of the feedback stage (104). If the representation of stabilization, based on this measurement, is not unfavorable (401), the process proceeds to step 400.

If the representation of stabilization is unfavorable (401), the phase of the multi-pole gain stage (102) is adjusted based on the degree of unfavorability (402). In a preferred embodiment, this is accomplished by increasing the gate voltage of the FET (207), serving as the stabilizer (106), as controlled by the output signal of the threshold detector (202) via the amplifier (203). Increasing the gate voltage of the FET (207) increases the conductance of the FET (207) and causes the phase of the network consisting of the FET (207) and capacitor (206) to be less negative by increasing the bandwidth of the network, hence causing the phase of the multi-pole gain stage (102) to be less negative. This shift in the phase of the multi-pole gain stage (102) causes the phase margin of the open loop system comprising the multi-pole gain stage (102), the quantizer (103), and the feedback stage (104) to increase allowing the A/D converter (100) to be more stable. Stated in another way, the phase adjustment is accomplished by repositioning the poles of the multi-pole gain stage (102). One skilled in the art can appreciate that the phase margin of the open loop system can be increased by decreasing the open loop gain and/or by increasing the bandwidth of the network and, furthermore, that for higher order systems this may entail actually increasing the phase shift of the multi-pole gain stage (102) over a certain frequency range or by re-positioning more than one pole.

Having adjusted the phase margin, the representation of the stabilization is again sampled (403), as in step 400. If the degree of unfavorability has not changed (404), the representation of the stabilization is again sampled (403). When the degree of unfavorability has changed (404), it is determined if the representation of stabilization is favorable (405). If the representation of stabilization is favorable (405), operation continues at step 400. Otherwise, operation continues at step 402 in an effort to further adjust the phase margin based on the degree of unfavorability. Throughout these adjustments, the A/D circuit (100) continues to provide a digital output (108).

The present invention provides a method and improved apparatus for stabilizing an A/D circuit when the analog input to the A/D circuit is excessive. With such a method, the complete loss of digital representation of the input signal when the analog input to the A/D circuit is excessive and the need to reduce the level of the analog input to the A/D circuit by a substantial amount, which were required in prior art solutions, are substantially eliminated. These difficulties are overcome by increasing the open-loop phase margin of the A/D circuit when the analog input is excessive, thereby increasing the stability of the A/D circuit, without temporarily disabling the entire A/D circuit or reducing the analog input signal level as was also required in some prior art solutions.

We claim:

1. In an analog-to-digital (A/D) circuit that includes a multi-pole gain stage, an input summation stage, a feedback stage, and a quantizer, wherein the feedback stage is operably coupled to an output of the quantizer and the input summation stage, and wherein the input summation stage sums an analog input signal with a feedback signal, a method for stabilizing the A/D circuit when the analog input signal is excessive, the method comprises the steps of:
   a) sampling a representation of stabilization of the A/D circuit;
   b) when the representation of stabilization is unfavorable, adjusting the multi-pole gain stage by increasing phase margin, wherein an increase in phase margin is based on degree of unfavorability of the representation of stabilization; and
   c) providing, by the A/D circuit at the increased phase margin, digital representations of the analog input signal.

2. The method of claim 1 further comprises the steps of:
   d) while continually sampling the representation of stabilization, adjusting the multi-pole gain stage by increasing or decreasing the phase margin, wherein an increase or a decrease in the phase margin is based on the degree of unfavorability of the representation of stabilization.

3. In the method of claim 1, step (a) further comprises sampling the representation of stabilization, wherein the representation of stabilization is an output of the input summation stage.

4. In the method of claim 1, step (b) further comprises adjusting the multi-pole gain stage by increasing the phase margin based on the degree of unfavorability of the representation of stabilization, wherein the degree of unfavorability is indicated by a distorted representation of the analog input signal at the output of the quantizer.

5. In the method of claim 1, step (b) further comprises increasing the phase margin by decreasing an open-loop gain.

6. In the method of claim 1, step (b) further comprises increasing the phase margin by increasing bandwidth of the multi-pole gain stage.

7. An analog-to-digital (A/D) circuit that includes an input summation stage, a multi-pole gain stage, a quantizer, and a feedback stage, wherein the input summation stage sums an analog input signal with a feedback signal provided by the feedback stage, a resulting summation is amplified by the multi-pole gain stage and quantized by the quantizer to provide a digital representation of the analog input signal, the A/D circuit is improved to comprise:

a stabilization detector that is operably coupled to the input summer, wherein the stabilization detector detects when stabilization of the A/D circuit becomes unfavorable; and a stabilizer that is operably coupled to the multi-pole gain stage and the stabilization detector, wherein the stabilizer adjusts the multi-pole gain stage to increase phase margin when the stabilization detector detects that the stabilization of the A/D circuit is unfavorable.

8. An integrated circuit (IC) that includes an analog-to-digital (A/D) circuit, wherein the A/D circuit includes an input summation stage, a multi-pole gain stage, a quantizer, and a feedback stage, wherein the input summation stage sums an analog input signal with a feedback signal provided by the feedback stage, a resulting summation is amplified by the multi-pole gain stage and quantized by the quantizer to provide a digital representation of the analog input signal, the IC circuit is improved to comprise:

a stabilization detector that is operably coupled to the input summer, wherein the stabilization detector detects when stabilization of the A/D circuit becomes unfavorable; and a stabilizer that is operably coupled to the multi-pole gain stage and the stabilization detector, wherein the stabilizer adjusts the multi-pole gain stage to increase phase margin when the stabilization detector detects that the stabilization of the A/D circuit is unfavorable.

9. In a sigma-delta analog-to-digital (A/D) circuit that includes a second-order integrating filter, an input summation stage, a feedback stage, and a quantizer, wherein the feedback stage is operably coupled to an output of the quantizer and the input summation stage, and wherein the input summation stage sums an analog input signal with a feedback signal, a method for stabilizing the A/D circuit when the analog input signal is excessive, the method comprises the steps of:

a) sampling, by a stabilization detector, an output of the input summation stage;

b) when an unfavorable operating state is detected by the stabilization detector, increasing, by a stabilizer operably coupled to the second-order integrating filter, phase margin by adjusting pole locations of the second order integrating filter based on degree of unfavorability; and c) providing, by the sigma-delta A/D circuit at the increased phase margin, digital representations of the analog input signal.

10. The method of claim 9 further comprises the steps of:

d) while continually sampling the output of the input summation stage, increasing or decreasing, by the stabilizer, the phase margin by adjusting the pole locations of the second-order integrating filter, wherein an increase or a decrease in the phase margin is based on the degree of unfavorability.

11. In the method of claim 9, step (b) further comprises increasing the phase margin by adjusting the pole locations of the second-order integrating filter based on the degree of unfavorability, wherein the degree of unfavorability is indicated by a distorted representation of the analog input signal at the output of the quantizer.

12. In the method of claim 9, step (b) further comprises increasing the phase margin by decreasing an open-loop gain.

13. In the method of claim 9, step (b) further comprises increasing the phase margin by increasing bandwidth of the second-order integrating filter.

14. A sigma-delta analog-to-digital (A/D) circuit that includes an input summation stage, a multi-pole gain stage, a quantizer, and a feedback stage, wherein the input summation stage sums an analog input signal with a feedback signal provided by the feedback stage, a resulting summation is amplified by the multi-pole gain stage and quantized by the quantizer to provide a digital representation of the analog input signal, capable of stabilization when an analog input signal is excessive, the sigma-delta A/D circuit is improved to comprise:

a stabilization detector that is operably coupled to the input summer, wherein the stabilization detector detects when stabilization of the A/D circuit becomes unfavorable; and a stabilizer that is operably coupled to the multi-pole gain stage and the stabilization detector, wherein the stabilizer adjusts the multi-pole gain stage to increase phase margin when the stabilization detector detects that the stabilization of the A/D circuit is unfavorable.

* * * * *